United States Patent [19]
Park et al.

[11] Patent Number: 5,847,446
[45] Date of Patent: Dec. 8, 1998

[54] SEMICONDUCTOR CHIP PACKAGE HAVING CHIP ATTACH PAD WITH PERIMETER SLOTS

[75] Inventors: Sang Young Park, Taejeon; Jong Kon Choi, Cheonan, both of Rep. of Korea

[73] Assignee: Samsung Electronics Co., Ltd., Suwon, Rep. of Korea

[21] Appl. No.: 906,875

[22] Filed: Aug. 6, 1997

[30] Foreign Application Priority Data

Sep. 6, 1996 [KR] Rep. of Korea ................ 1996 38730

[51] Int. Cl.[6] .............................................. H01L 23/495
[52] U.S. Cl. ........................................ 257/676; 257/666
[58] Field of Search ..................................... 257/666, 676

[56] References Cited

U.S. PATENT DOCUMENTS

| | | | |
|---|---|---|---|
| 4,952,999 | 8/1990 | Robinson et al. | 257/676 |
| 5,708,294 | 1/1998 | Toriyama | 257/676 |
| 5,712,507 | 1/1998 | Eguchi et al. | 257/676 |

*Primary Examiner*—Mahshid D. Saadat
*Assistant Examiner*—S. V. Clark
*Attorney, Agent, or Firm*—Jones & Volentine, L.L.P.

[57] ABSTRACT

A semiconductor chip package comprises a chip attach pad having a slot formed in a perimeter region thereof. A chip having input/output pads thereon is bonded with the chip attach pad, and leads corresponding to the input/output pads are arranged around the chip. Each lead is electrically coupled to each input/output pad by a bonding wire. The chip, the chip attach pad, bonding wires, and leads are encapsulated by a molding compound. The slot of the chip attach pad corresponds to edges of the chip, so that the lower surface edges of the chip are located along the slot and are exposed through the slot. The molding compound is contained within the slot of the chip attach pad, and adheres to the lower surface edges of the chip. Accordingly, failures such as delaminations or cracks can be prevented. The slot may be divided into several discrete slots, and a tie-bar may be joined to the chip attach pad.

20 Claims, 3 Drawing Sheets

SEMICONDUCTOR CHIP PACKAGE HAVING CHIP ATTACH PAD WITH PERIMETER SLOTS

BACKGROUND OF THE INVENTION

1. Field of the Invention

The present invention relates generally to a semiconductor chip package, and more particularly, to a plastic-molded semiconductor chip package having a chip attach pad with slots formed in a perimeter area thereof so that lower surfaces at the edges of a chip are located along the slots and mold resin adheres to the lower edge surfaces exposed through the slots.

2. Description of the Related Art

The continuing trend in the electronics industry today is to make products that are lighter, smaller, faster, more multi-functional, more powerful, more reliable, and less expensive. One of the key technologies to make these product design goals possible is electronic packaging and assembly technology. The major functions of electronic packaging are: (1) to provide a path for the electrical current that powers the circuits on the chip; (2) to distribute the signals onto and off the chip; (3) to remove the heat generated by the circuits on the chip; and (4) to support the chip and protect it from hostile external environments.

A conventional plastic-molded semiconductor chip package has a chip attach pad on which a semiconductor chip is mounted and attached. Input/output pads on the chip are coupled to leads by means of bonding wires. The leads, the chip, the chip attach pad, and the wires are encapsulated by molding compound. The structure of a conventional plastic-molded package is shown in FIGS. 1 and 2.

FIG. 1 is a partially cut away perspective view of a conventional semiconductor chip package 100, and FIG. 2 is a cross-sectional view taken along the line II—II of FIG. 1. As shown in FIGS. 1 and 2, a conventional plastic-molded package 100 has a semiconductor chip 10, which has input/output pads 12 formed thereon, and a chip attach pad 20 on which the chip 10 is mounted and attached by an adhesive 30. The input/output pads 12 on the chip 10 are electrically coupled to leads 50 by means of bonding wires 40. The chip 10 and the chip attach pad 20 are encapsulated by molding compound 60 so as to protect them from hostile environments. Wire-bonded portions of the leads 50 and the wires 40 are also encapsulated by the molding compound 60, but the other portions of the leads 50 extend outwardly from the molding compound 60. Reference numeral 22 in FIG. 1 designates tie-bars for holding the chip attach pad 20 securely.

The chip attach pad 20 and the leads 50 are made of metals such as copper alloys or Fe—Ni alloys, while the molding compound 60 and the adhesive 30 are mainly made of resins. Among different materials, however, there exist differences in the coefficients of thermal expansion (CTE). When the package is suddenly exposed to a large temperature swing, the differences in the CTE may reduce the interfacial integrity between the chip attach pad and the molding compound or the adhesive, because the interfacial integrity is highly susceptible to thermal and mechanical stresses. These stresses in the package can result in not only delaminnations (i.e., separation at the interface), but also accompanying cracks of the molding compound. Such package cracking is generally caused by a considerable amount of pressure due to abrupt vaporization of moisture, which is either accumulated in voids at the interface or absorbed by the molding compound itself. In addition, corrosion of the input/output pads on the chip may occur when moisture and contaminants reach the surface of the chip.

One approach that has been proposed to solve some of these problems is to increase the adhesion of the molding compound to the chip, thereby minimizing delamination and voids, where moisture can concentrate in the package. An opening 24, shown in FIG. 2, centrally formed through the chip attach pad 20 makes this approach possible. However, considering that such undesirable phenomenon as delamination or cracks chiefly originate at the edge or perimeter portions of the chip or the chip attach pad, this solution is not very effective since the opening 24 is formed at a central location of the chip. Moreover, the tie-bars 22 may provide the paths through which moisture or contaminants reach the edge or the surface of the chip.

SUMMARY OF THE INVENTION

It is therefore an object of the present invention to provide improved semiconductor chip packages with enhanced adhesion of a molding compound to a semiconductor chip.

It is another object of the present invention to provide semiconductor chip packages with higher reliability.

These and other objects according to the present invention are attained by a semiconductor chip package comprising a chip attach pad having at least one slot formed in a perimeter region thereof. A semiconductor chip having a plurality of input/output pads thereon is bonded with the chip attach pad. The semiconductor chip package according to the present invention also includes a plurality of leads arranged around the chip wherein each of the leads corresponds to a respective one of the input/output pads. Furthermore, one end portion of each lead is electrically coupled to the corresponding input/output pad by means of a bonding wire. The chip, the chip attach pad, the bonding wires, and the inner end portion of each lead are encapsulated by a molding compound.

In particular, the slot of the chip attach pad is formed at the perimeter region corresponding to edges of the semiconductor chip, so that the lower surfaces at the edges of the chip are located along the slot and are exposed through the slot. Since the molding compound is contained within the slot of the chip attach pad, and adheres to the lower surfaces of the edges of the chip, failures such as delaminations or cracks can be diminished.

The slot may be divided into a plurality of discrete slots along the perimeter region of the chip attach pad. The semiconductor chip is attached to an inside area surrounded by the plurality of discrete slots of the chip attach pad. The inside area of the chip attach pad is smaller than the chip, whereas the entire area of the chip attach pad is larger than the chip.

The chip attach pad may be square or rectangular shaped. The package according to the present invention may further comprise at least one tie-bar which is joined to the chip attach pad. In this case, the slot may be formed in a perimeter region of the chip attach pad, preferably being adjacent to the tie-bar.

BRIEF DESCRIPTION OF THE DRAWINGS

These and various other features and advantages of the present invention will be described below with reference to the accompanying drawings, wherein like reference numerals designate like structural elements, and, in which.

Figure 3:
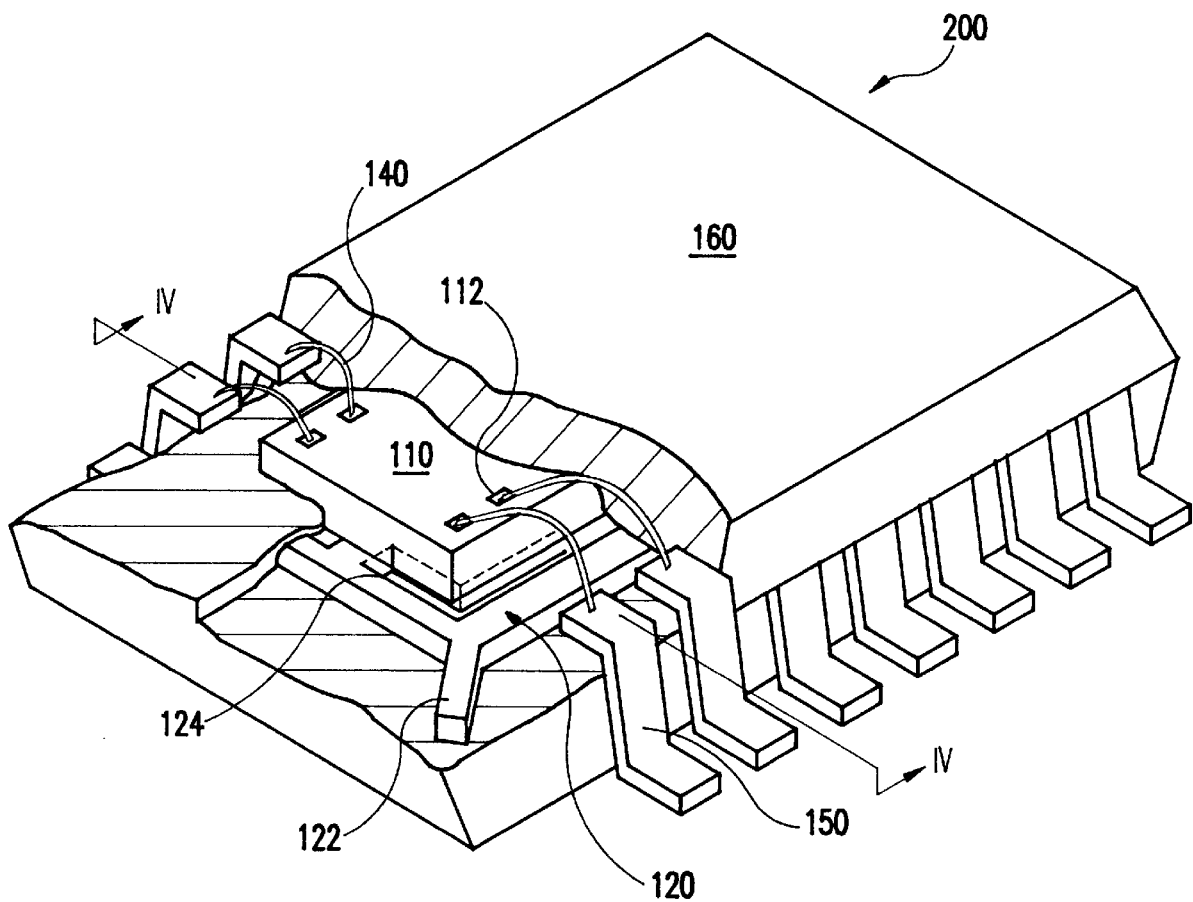
FIG. 3 is a partially cut away perspective view of one embodiment of a semiconductor chip package according to the present invention, employing a chip attach pad having slots formed in perimeter region corresponding to the edges of a semiconductor chip package according to the present invention, employing a chip attach pad having slots formed in perimeter region corresponding to the edges of a semiconductor chip.
Figure 4:
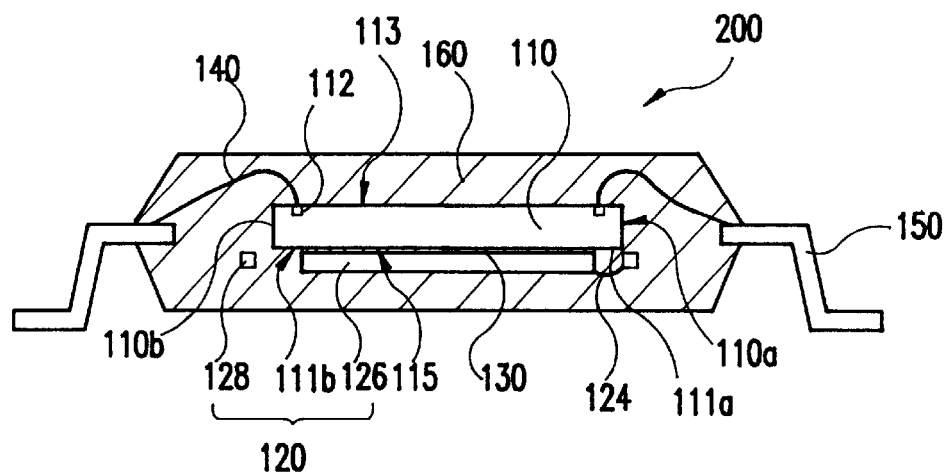
FIG. 4 is a cross-sectional view taken along the line IV—IV of FIG. 3.

FIG; 5 is a an view of one embodiment of the chip attach pad having the slots, employed in the semiconductor chip package of FIGS. 3 and 4.

DETAILED DESCRIPTION OF THE PRESENT INVENTION

The present invention will now be described more fully hereinafter with reference to accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

FIG. 3 is a partially cut away perspective view of one embodiment of a semiconductor chip package 200 according to the present invention, employing a chip attach pad 120 having slots 124 formed in a perimeter region of the chip attach pad 120 corresponding to the edges of a semiconductor chip 110. FIG. 4 is a cross-sectional view taken along the line IV—IV of FIG. 3, and FIG. 5 is a plan view of the chip attach pad 120 having the slots 124, employed in the semiconductor chip package 200 of FIGS.3 and 4.

Figure 5:
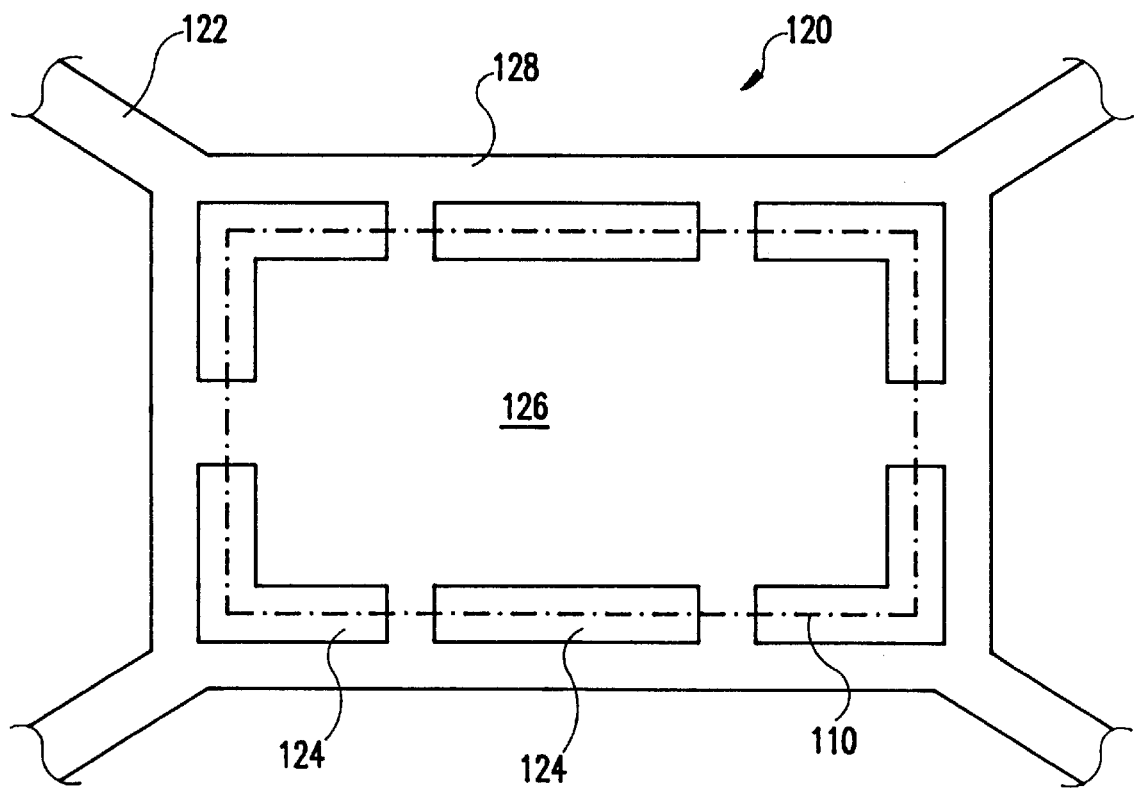

Referring to FIGS. 3 through 5, the semiconductor chip package 200 comprises the chip attach pad 120 in which at least one slot 124 is formed along a perimeter region thereof. A semiconductor chip 110 is bonded on the chip attach pad 120. The semiconductor chip 110 has a plurality of input/output pads 112 which are formed on the upper surface 113 of the chip 110. The lower surface 115 of the chip 110 is bonded to the chip attach pad 120 by means of an adhesive 130. A plurality of leads 150 are arranged around the chip 110, the leads 150 being electrically coupled to respective ones of the input/output pads 112 at one end by means of bonding wires 140. The chip 110, the chip attach pad 120, the bonding wires 140, and the wire-bonded portions of the leads 140 are encapsulated by a molding compound 160. The other end of each lead 150 extends outwardly from the molding compound 160. An epoxy molding compound (EMC) is preferably used for the molding compound 160.

The molding compound 160 is also contained within the slot 124 of the chip attach pad 120. Since the slot 124 is formed in the perimeter region of the chip attach pad 120 corresponding to edges 110a, 110b of the chip 110, the edges 110a, 110b of the chip 110 are located along the slot 124. The lower surfaces 111a, 111b of the edges 110a, 110b of the chip 110 are exposed through the slot 124. Therefore, the lower surface 111a, 111b do not lie on the chip attach pad 120, but on the molding compound 160 within the slot 124. Thus, the molding compound 160 directly adheres to the lower surfaces 111a, 111b of the edges 110a, 110b of the chip 110. In other words, the edge portions of the chip 110, which are vulnerable points for delaminations or crack formations, may be closely adhered with the molding compound 160, and the enhanced adhesion produced by this direct contact between the molding compound 160 and the chip 110 can reduce the possibility of package failures.

The chip attach pad 120 may have a square or rectangular shape. Most chip attach pads 120 are preferably larger than the chip 110 in order to stably support the chip 110, although the chip attach pad 120 may be smaller than the chip 110. It is, however, not the entire chip attach pad 120 to which the chip 110 is actually attached, but an inner central region 126 surrounded with the slot 124 of the chip attach pad 120. The inner central region 126 of the chip attach pad 120 is smaller than the chip 110, and thus the edges of the chip 110 can be exposed through the slot 124.

Although the inner central region 126 of the chip attach pad 120 is seperated from the outer peripheral region 128 by the slot 124, both areas 126 and 128 are connected to each other at certain points. Accordingly, the slot 124 may be divided into a plurality of slots along the perimeter region of the chip attach pad 120. FIG. 5 illustrates one example of the chip attach pad 120 having a plurality of slots 124.

The package 200 according to the present invention may further comprise at least one tie-bar 122 which is joined to the chip attach pad 120. The tie-bar 122 provides the chip attach pad 120 with a mechanical stability. When the tie-bar 122 is joined to the chip attach pad 120, the slot 124 of the chip attach pad 120 is formed in a perimeter region, preferably adjacent to the tie-bar 122. The slot 124 adjacent to the tie-bar 122 has an L-shape and thus obstructs the paths through which moisture or contaminants could reach the edges 110a, 110b or the surface of the chip 110, and further, can prevent corrosion of the input/output pads 112 and delaminations or cracks due to moisture absorption.

Figure 1:
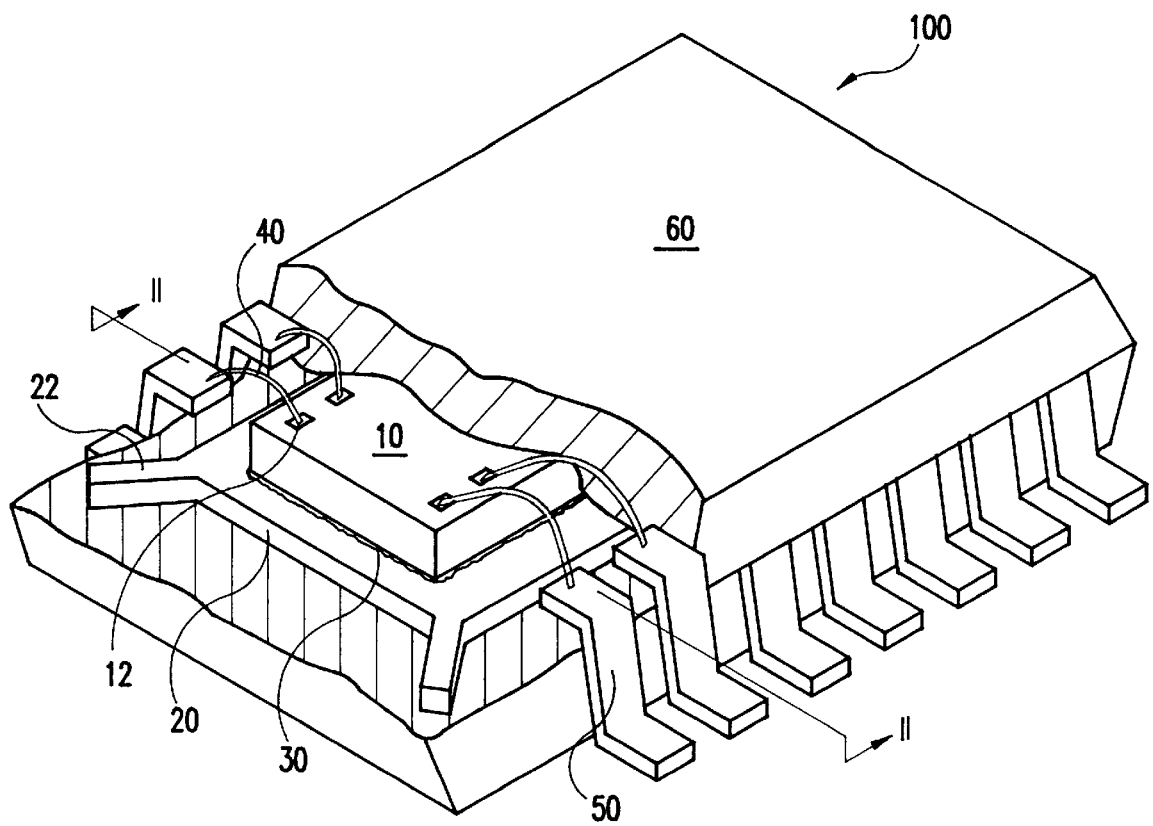
FIG. 1 is a partially cut away perspective view of a conventional semiconductor chip package.
Figure 2:
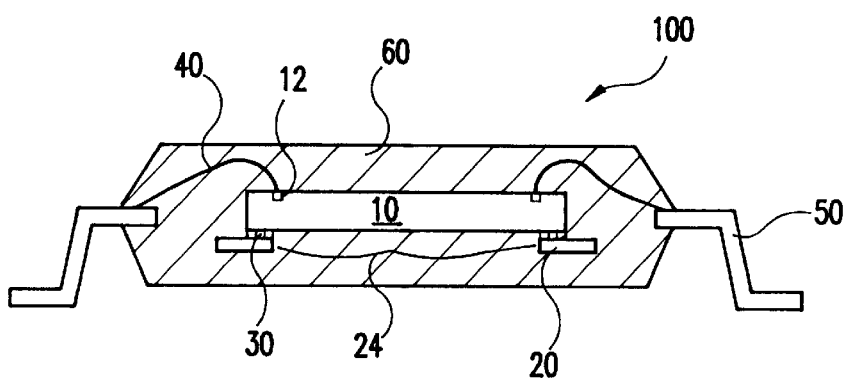
FIG. 2 is a cross-sectional view taken along the line II—II of FIG. 1.

The conventional packages having a central opening 24 in the chip attach pad 20 (see FIG. 2) have difficulty in adapting to various types and sizes of chips since the opening must be of sufficient area in order to achieve the expected results. On the other hand, the package of the present invention can accommodate various types and sizes of the chips, since the slots can be readily formed in the proper locations.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor chip package comprising:

a semiconductor chip having a first surface, a second surface, outer edges extending between said first and second surfaces, and a plurality of input/output pads at said first surface;

a chip attach pad bonded to said second surface of said semiconductor chip, said chip attach pad having an inner central region, an outer peripheral region, a perimeter region separating said inner central region from said outer peripheral region, and at least one slot in said perimeter region, each said at least one slot extending longitudinally in the direction of said outer edges of said semiconductor chip, and said outer edges being located along said at least one slot such that lower surfaces of the chip meeting said outer edges are exposed through said at least one slot;

a plurality of leads arranged around said semiconductor chip, each of said leads corresponding to a respective one of said input/output pads;

bonding wires electrically coupling respective end portions of said leads to said input/output pads; and a molding compound encapsulating said chip, said chip attach pad, said bonding wires, and the end portions of said leads.

2. The semiconductor chip package according to claim 1, wherein said molding compound occupies said at least one slot of said chip attach pad, whereby said molding compound directly adheres to said lower surfaces.

3. The semiconductor chip package according to claim 3, wherein said at least one slot comprises a plurality of slots extending along the perimeter region of said chip attach pad.

4. The semiconductor chip package according to claim 3, wherein said semiconductor chip is attached to the inner central region of said chip attach pad.

5. The semiconductor chip package according to claim 4, wherein the inner central region of said chip attach pad is smaller than an area of said semiconductor chip, and the entire area of said chip attach pad is larger than the area of said semiconductor chip.

6. The semiconductor chip package according to claim 2, wherein said chip attach pad has one of a square-shape and a rectangular-shape.

7. The semiconductor chip package according to claim 2, and further comprising at least one tie-bar extending from said chip attach pad at said outer peripheral region.

8. The semiconductor chip package according to claim 7, wherein said at least one slot in the perimeter region of said chip attach pad extends adjacent to said tie-bar.

9. The semiconductor chip package according to claim 2, wherein said molding compound comprises an epoxy molding compound.

10. A semiconductor chip package comprising:

a semiconductor chip having a first surface, a second surface, outer edges extending between said first and second surfaces, and a plurality of input/output pads at said first surface;

a chip attach pad bonded to said second surface of said semiconductor chip, said chip attach pad having an inner central region, an outer peripheral region, a perimeter region separating said inner central region from said outer peripheral region, and said chip attach pad having an opening extending therethrough only in said perimeter region, said opening comprising at least one slot, and said outer edges of said chip being located along said at least one slot such that lower surfaces of the chip meeting said outer edges are exposed through said at least one slot;

a plurality of leads arranged around said semiconductor chip, each of said leads corresponding to a respective one of said input/output pads;

bonding wires electrically coupling respective end portions of said leads to said input/output pads; and a molding compound encapsulating said chip, said chip attach pad, said bonding wires, and the end portions of said leads.

11. The semiconductor chip package according to claim 10, wherein said molding compound occupies said at least one slot of said chip attach pad, whereby said molding compound directly adheres to said lower surfaces.

12. The semiconductor chip package according to claim 11, wherein said at least one slot comprises a plurality of slots extending along the perimeter region of said chip attach pad.

13. The semiconductor chip package according to claim 12, wherein said semiconductor chip is attached to the inner central region of said chip attach pad.

14. The semiconductor chip package according to claim 13, wherein the inner central region of said chip attach pad is smaller than an area of said semiconductor chip, and the entire area of said chip attach pad is larger than the area of said semiconductor chip.

15. The semiconductor chip package according to claim 11, wherein said chip attach pad has one of a square-shape and a rectangular-shape.

16. The semiconductor chip package according to claim 11, and further comprising at least one tie-bar extending from said chip attach pad at said outer peripheral region.

17. The semiconductor chip package according to claim 16, wherein said at least one slot in the perimeter region of said chip attach pad extends adjacent to said tie-bar.

18. The semiconductor chip package according to claim 11, wherein said molding compound comprises an epoxy molding compound.

19. The semiconductor chip package according to claim 6, and further comprising at least one tie-bar extending from said chip attach pad at said outer peripheral region, and wherein said at least one slot has an L-shape adjacent to said tie-bar.

20. The semiconductor chip package according to claim 15, and further comprising at least one tie-bar extending from said chip attach pad at said outer peripheral region, and wherein said at least one slot has an L-shape adjacent to said tie-bar.

* * * * *